(12) United States Patent
Oumaru et al.

(10) Patent No.: US 7,242,113 B2
(45) Date of Patent: Jul. 10, 2007

(54) POWER SEMICONDUCTOR DEVICE

(75) Inventors: Takeshi Oumaru, Tokyo (JP); Noboru Miyamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 401 days.

(21) Appl. No.: 10/686,616

(22) Filed: Oct. 17, 2003

(65) Prior Publication Data

US 2004/0252430 A1 Dec. 16, 2004

(30) Foreign Application Priority Data

Jun. 12, 2003 (JP) ............................ 2003-167315

(51) Int. Cl.
*H01H 35/00* (2006.01)
*H02H 5/04* (2006.01)

(52) U.S. Cl. ..................... 307/117; 361/103; 361/93.8

(58) Field of Classification Search ............... 361/103, 361/93.8, 93.9, 94, 97; 307/112, 117
See application file for complete search history.

(56) References Cited

U.S. PATENT DOCUMENTS

| | | | | |
|---|---|---|---|---|
| 5,177,659 A | * | 1/1993 | Zisa et al. | .................. 361/103 |
| 5,351,162 A | * | 9/1994 | Koishikawa | .................. 361/18 |
| 6,208,041 B1 | | 3/2001 | Majumdar et al. | |
| 6,429,691 B1 | * | 8/2002 | Yang | .......................... 326/126 |
| 6,577,173 B2 | | 6/2003 | Ikezawa | |
| 6,697,283 B2 | * | 2/2004 | Marotta et al. | ........ 365/185.21 |
| 6,890,048 B2 | * | 5/2005 | Hirayama | ..................... 347/12 |

FOREIGN PATENT DOCUMENTS

| | | |
|---|---|---|
| JP | 8-191239 | 7/1996 |
| JP | 2000-92820 | 3/2000 |
| JP | 2001-169401 | 6/2001 |
| JP | 2002-95240 | 3/2002 |
| JP | 2002-208849 | 7/2002 |

* cited by examiner

*Primary Examiner*—Brian Sircus
*Assistant Examiner*—Michael Rutland-Wallis
(74) *Attorney, Agent, or Firm*—Oblon, Spivak, McClelland, Maier & Neustadt, P.C.

(57) ABSTRACT

A power semiconductor device which makes a heat come hard to arise in a particular element and is able to control an increase of the amount of a power loss caused by a tail current, even in case that plural power semiconductor elements are connected in parallel is provided.

A control part (CTa) performs a regional control instead of a general control that all of IGBT elements (PD1 to PD4) are made to operate identically with providing a PWM signal (S0) for all of the elements. In other words, when a certain pulse in a pulse row of the PWM signal (S0) is inputted, only a part of switches (SW1 and SW2) is turned on and only a part of the IGBT elements (PD1 and PD2) is made to operate, and when a next pulse is inputted, only the other part of switches (SW3 and SW4) is turned on and only the other part of IGBT elements (PD3 and PD4) is made to operate. Moreover, the operation described above is repeated.

8 Claims, 14 Drawing Sheets

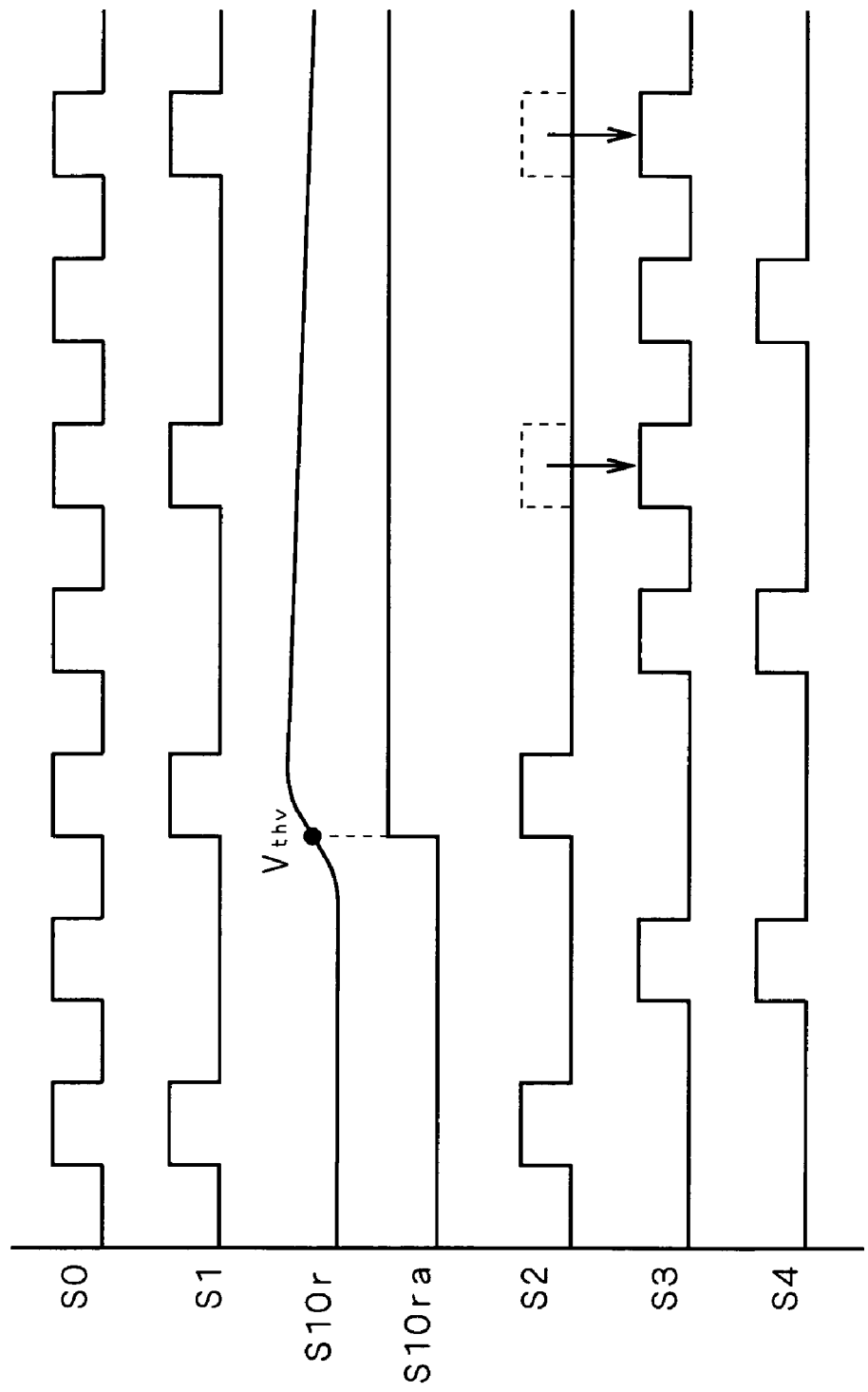

POWER SEMICONDUCTOR DEVICE

BACKGROUND OF THE INVENTION

1. Field of the Invention

The present invention relates to a power semiconductor device including plural power semiconductor elements to drive a load.

2. Description of the Background Art

A power semiconductor element such as a power MOSFET (Metal Oxide Semiconductor Field Effect Transistor), an IGBT (Insulated Gate Bipolar Transistor) and so on is applied as a control device to drive a load flowing a large current.

A technique of a power semiconductor device that such the power semiconductor element is plurally connected in parallel and a controllable current amount is made to increase is described in Japanese Patent Application Laid-Open No. 8-191239 (1996). Besides, Japanese Patent Application Laid-Open Nos. 2000-92820, 2002-95240, 2001-169401 and 2002-208849 are additional prior art documents corresponding to the present invention.

In case that the plural power semiconductor elements are connected in parallel, a current tends to flow in a particular element in the parallel connection in larger amounts, if there is a difference in an electric characteristic of the respective elements. According to this, an element in which the current flows in larger amounts runs a temperature substantially and a life of the element tends to be short.

In the case that the plural power semiconductor elements are connected in parallel, a current tends to flow in a particular element in the parallel connection in larger amounts, if there is a difference in an electric characteristic of the respective elements. According to this, an element in which the current flows in larger amounts runs a temperature substantially higher and a life of the element tends to be short.

Moreover, there is a steady loss occurring in an ON action and a switching loss occurring in a switching period in a power loss generated in the power semiconductor element. The steady loss is attributable mainly to an ON resistance in the ON action, and the switching loss is attributable mainly to a tail current in a turn-off state.

The steady loss increases according to an increase of a conducting current of the power semiconductor element. In the meantime, a value of the tail current which is a major reason for the switching loss is substantially constant regardless of the conducting current amount. Accordingly, the amount of the power loss caused by the tail current is proportional to the number of the parallel connection of the power semiconductor element and the number of switching of the power semiconductor element.

That is to say, the more the number of the parallel connection of the power semiconductor element increases and the higher a switching frequency becomes, the more the amount of the power loss caused by the tail current is supposed to increase. Particularly, in case of bringing into action with a current value low enough as compared to a rated current of the power semiconductor element and with a high switching frequency, proportion of the switching loss to an overall loss which is an aggregation of the steady loss and the switching loss becomes high, thus the amount of the power loss caused by the tail current has a great influence.

SUMMARY OF THE INVENTION

It is an object of the present invention to provide a power semiconductor device which makes a heat come hard to arise in a particular element and is able to control an increase of the amount of a power loss caused by a tail current, even in case that plural power semiconductor elements are connected in parallel.

According to an aspect of the present invention, a power semiconductor device includes plural power semiconductor elements and a control part.

The plural power semiconductor elements have a control electrode and a first and a second current electrodes, respectively, and the first current electrodes are connected with each other and the second current electrodes are connected with each other, respectively.

The control part controls the plural power semiconductor elements.

The control part repeats a regional control to bring a part of the plural power semiconductor elements into action by providing an input signal for a part of the control electrodes, and to bring another part of the plural power semiconductor elements into action by providing the input signal for another part of the control electrodes after an operation of the part is finished.

The control part repeats a regional control to bring a part of the plural power semiconductor elements into action, and to bring another part of the plural power semiconductor elements into action after the operation of the part is finished. Therefore, it becomes possible to make a current amount flowing in the respective power semiconductor elements equal, and a heat in a particular power semiconductor device does not become excessive. Moreover, a substantial number of the parallel connection in an operation of a part or another part of the plural power semiconductor elements is less than an actual number of the parallel connection. Therefore, it is possible to control an increase of the amount of a power loss caused by a tail current.

These and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a timing chart illustrating an aspect of the respective signals when a regional control is performed.

DESCRIPTION OF THE PREFERRED EMBODIMENTS

Preferred Embodiment 1

The present preferred embodiment is a power semiconductor device repeating a regional control to bring a part of plural power semiconductor elements connected with each other in parallel into action and to bring another part into action after an operation of the part is finished.

Figure 1:
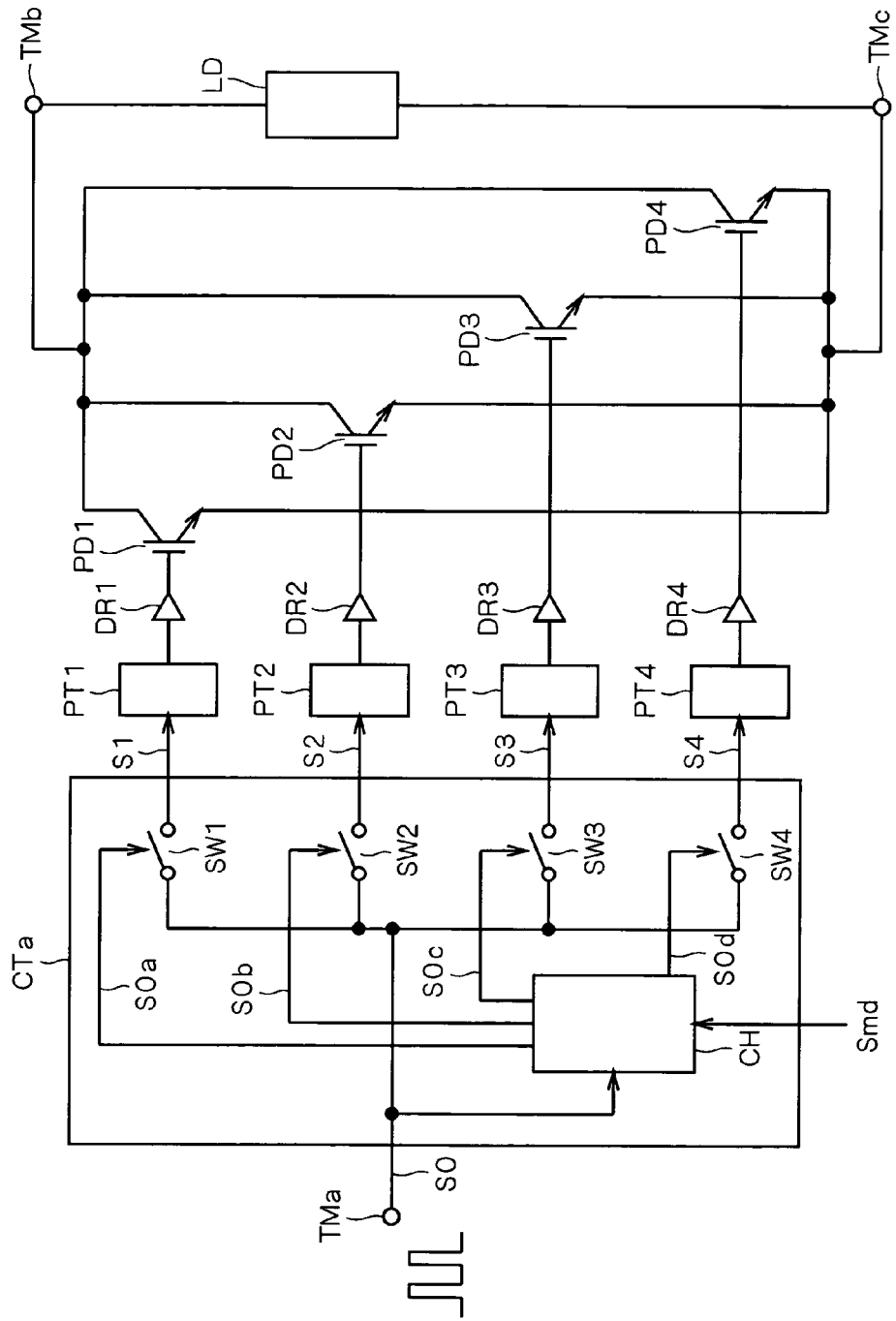
FIG. 1 is a drawing illustrating a power semiconductor device according to a preferred embodiment 1.

FIG. 1 is a drawing illustrating the power semiconductor device according to the present preferred embodiment. This power semiconductor device includes IGBT elements PD1 to PD4 which are the power semiconductor elements to drive a load LD. Besides, collectors of the IGBT elements PD1 to PD4 are connected with each other and emitters of the IGBT elements PD1 to PD4 are connected with each other, and they lead to terminals TMb and TMc, respectively. Moreover, the load LD is a motor and so on, and is connected to the terminals TMb and TMc.

Output terminals of amplifiers DR1 to DR4 are connected with gates of the IGBT elements PD1 and PD4, respectively. Protection circuits PT1 to PT4 are connected with input terminals of the amplifiers DR1 to DR4, respectively.

Moreover, the power semiconductor device according to the present preferred embodiment also includes a control part CTa controlling the IGBT elements PD1 to PD4. A PWM (Pulse Width Modulation) signal S0 which is an input signal is inputted to a terminal TMa, and after distributed to signals S1 to S4 at the control part CTa, they are inputted to the protection circuits PT1 to PT4, respectively.

The control part CTa includes single-pole single-throw switches SW1 to SW4 and a switching part CH. A mode designation signal Smd from an user is inputted to the switching part CH. The switches SW1 to SW4 are placed in the middle of distribution routes from the PWM signal S0 to the signals S1 to S4, and the switching part CH indicates respective ON/OFFs of the switches SW1 to SW4 by signals S0a to S0d, respectively, according to contents of the mode designation signal Smd.

Figure 2:
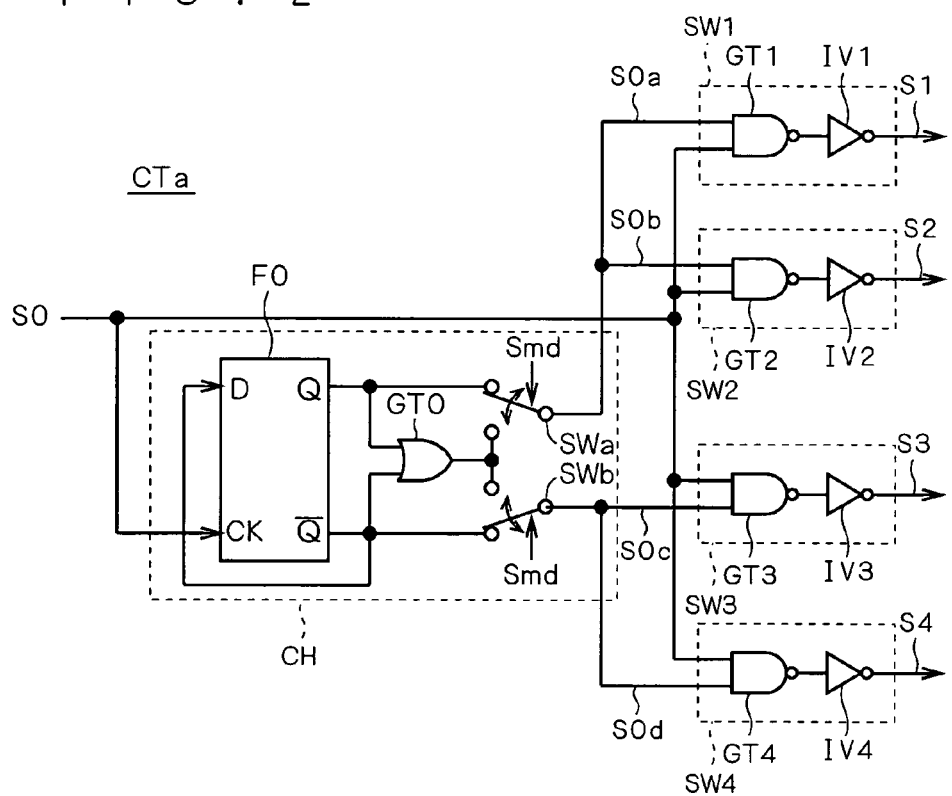
FIG. 2 is a drawing illustrating a control part of the power semiconductor device according to the preferred embodiment 1.

FIG. 2 is a drawing illustrating an example of a concrete composition of the control part CTa. As illustrated in FIG. 2, the switching part CH includes a D-flip-flop F0, an OR gate GT0 and single-pole double-throw switches SWa and SWb. Moreover, the respective switches SW1 to SW4 are composed of series connections of NAND gates GT1 and GT4 and inverters IV1 to IV4, respectively.

The PWM signal S0 is inputted to a clock input terminal CK of the D-flip-flop F0 and input terminals of the respective NAND gates GT1 to GT4. An output terminal Q of the F-flip-flop F0 is connected with one input terminal of the OR gate GT0 and one edge of the double-throw of the switch SWa. An inverted output terminal/Q of the D-flip-flop F0 is connected with another input terminal of the OR gate GT0, one edge of the double-throw of the switch SWb and a signal input terminal D of the D-flip-flop F0.

An output terminal of the OR gate GT0 is connected with other edges of the double-throws of the switches SWa and SWb in common. Moreover, the single pole of the switch SWa is connected with other input terminals of the NAND gates GT1 and GT2. Moreover, the single pole of the switch SWb is connected with other input terminals of the NAND gates GT3 and GT4. The mode designation signal Smd is employed for switching a signal route in the switches SWa and SWb.

Next, an operation of the power semiconductor device according to the present preferred embodiment is described. With regard to this power semiconductor device, the control part CTa can select either performing a general control bringing all of the IGBT elements PD1 to PD4 into action identically or repeating a regional control bringing a part of the IGBT elements PD1 to PD4 into action and bringing another part of the IGBT elements PD1 to PD4 into action after an operation of the part finished on the basis of the contents of the mode designation signal Smd from the user.

The mode designation signal Smd is a 1 bit signal. Moreover, it is defined that in case that the contents indicate "0", the user indicates the regional control, and in case that the contents indicate "1", the user indicates the general control.

In case that "0" is inputted as the mode designation signal Smd, the switch SWa in FIG. 2 transmits an output of the output terminal Q of the D-flip-flop F0 to the respective switches SW1 and SW2 as signals S0a and S0b. Moreover, the switch SWb transmits an output of the inverse output terminal/Q of the D-flip-flop F0 to the respective switches SW3 and SW4 as signals S0c and S0d.

In the meantime, in case that "1" is inputted as the mode designation signal Smd, both the switches SWa and SWb in FIG. 2 transmit an output of the OR gate GT0 to the respective switches SW1 to SW4 as signals S0a to S0d.

Meanwhile, "Hi" or "Low" at the signal input terminal D appears in the output terminal Q of the D-flip-flop F0 every time when the signal is inputted to the clock input terminal CK. Here, when considering a case that the signal in the signal input terminal D is "Hi" and a pulse is inputted to the clock input terminal CK, "Hi" appears in the output terminal Q. Moreover, "Low" appears in the inverse output terminal/Q.

The inverse output terminal/Q of the D-flip-flop F0 is connected with the signal input terminal D, thus the signal in the signal input terminal D changes into "Low" when "Low" appears in the inverse output terminal/Q. Moreover, when a next pulse is inputted to the clock input terminal CK, "Low" appears in the output terminal Q and "Hi" appears in the inverse output terminal/Q.

Therefore, "Hi" and "Low" appear alternately in the output terminal Q of the D-flip-flop F0 every time when a clock is inputted, and moreover, a signal row that "Hi" and "Low" are reversed from that of the output terminal Q appears in the inverse output terminal/Q.

In case of the regional control, the output of the output terminal Q of the D-flip-flop F0 is transmitted to the respective switches SW1 and SW2, and the output of the inverse output terminal/Q is transmitted to the respective switches SW3 and SW4. The PWM signal S0 is inputted to the clock input terminal CK and input terminals of the respective NAND gates GT1 to GT4, thus a timing chart of the signals S0 to S4 is such as to be illustrated in FIG. 3.

In other words, when a pulse in a pulse row of the PWM signal S0 is inputted, the PWM signal S0 is outputted to the protection circuits PT1 and PT2 as the signals S1 and S2 by the switches SW1 and SW2. Moreover, when a next pulse is inputted, the PWM signal S0 is outputted to the protection circuits PT3 and PT4 as the signals S3 and S4 by the switches SW3 and SW4. Afterwards, the operation described above is repeated.

Besides, the protection circuits PT1 to PT4 are all circuits preventing a feedback of a high voltage generated in the IGBT elements PD1 to PD4 to the control part CTa, and moreover, the amplifiers DR1 to DR4 are circuits amplifying the respective signals S1 to S4 and providing them for the IGBT elements PD1 to PD4.

Therefore, when the regional control is performed, the control part CTa repeats a control bringing the IGBT elements PD1 and PD2 into action by providing the PWM signal S0 for the gate of them and after the operation is finished, then bringing the IGBT elements PD3 and PD4 into action by providing the PWM signal S0 for the gate of them.

Besides, the PWM signal S0 is inputted to the clock input terminal CK of the D-flip-flop F0, thus the operation of the IGBT elements PD1 and PD2 and the operation of the IGBT elements PD3 and PD4 are performed on each pulse basis.

Figure 4:
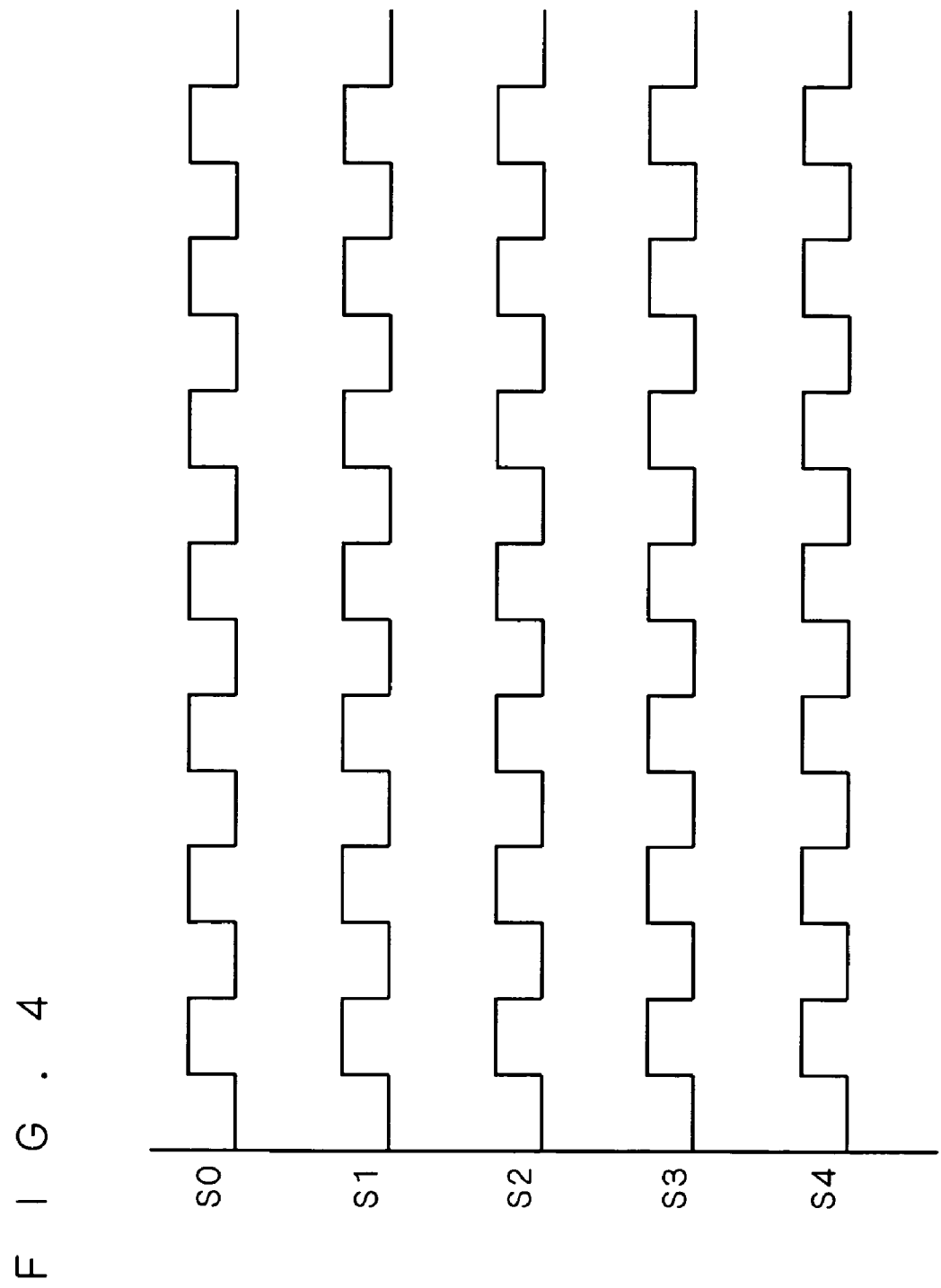
FIG. 4 is a timing chart illustrating an aspect of the respective signals when a general control is performed.

In the meantime, in case of the general control, the output of the OR gate GT0 is transmitted to the respective switches SW1 to SW4. The both signals of output terminal Q and the inverse output terminal/Q of the D-flip-flop F0 are inputted to the OR gate GT0, thus the output of the OR gate GT0 becomes "Hi" constantly. Therefore, a timing chart of the signals S0 to S4 is such as to be illustrated in FIG. 4.

In other words, the pulse row of the PWM signal S0 is directly outputted to the protection circuits PT1 to PT4 as the signals S1 to S4 through the switches SW1 to SW4. Therefore, when the general control is performed, the control part CTa brings the IGBT elements PD1 to PD4 into action identically by providing the PWM signal S0 for the entire gates of them.

According to the power semiconductor device according to the present preferred embodiment, the control part CTa repeats a control bringing a part of the IGBT elements PD1 to PD4 into action and after an operation of the part is finished, then bringing another part of the IGBT elements to PD1 to PD4 into action, when the regional control is performed.

In case the general control is performed to the IGBT elements PD1 to PD4, for example, there is a case that a current does not tend to flow in the IGBT element PD4 but an extra current which should flow in the IGBT element PD4 tends to flow in the IGBT element PD1.

However, by performing the regional control described above, the IGBT element PD1 only operates with the IGBT element PD2 synchronously, and the IGBT element PD4 only operates with the IGBT element PD3 synchronously. According to this, it becomes possible to make a current amount flowing in the respective IGBT elements PD1 to PD4 equal, and a heat in a particular IGBT element becomes hard to arise.

Moreover, a substantial number of the parallel connection in the respective IGBT elements PD1 to PD4 is less than an actual number of the parallel connection when the regional control is performed. In other words, in case that the IGBT elements PD1 and PD2 operate synchronously, and in case that the IGBT elements PD3 and PD4 operate synchronously, the substantial number of the parallel connection is supposed to be 2, less than 4 of the actual number of the parallel connection in both cases.

Therefore, according to the fact that the amount of the power loss caused by a tail current is proportional to the number of the parallel connection of the IGBT element, it is possible to control an increase of the amount of the power loss caused by the tail current.

Moreover, with regard to the power semiconductor device according to the present preferred embodiment, the control part CTa can select either perform the general control or repeats the regional control.

Here, a table 1 is a description of one experimental result of the power semiconductor device according to the present preferred embodiment.

TABLE 1

| Mode | Steady Loss [W] | Switching Loss [W] | Overall Loss [W] |
|---|---|---|---|
| General Drive | 15.000 | 106.870 | 121.870 |
| Regional Drive | 18.750 | 85.496 | 104.246 |
| Rate of Change | Rise by 25% | Fall by 20% | Fall by 14% |

With regard to this table, the "general drive" mode indicates a case that the general control is performed to the IGBT elements PD1 to PD4, described above, and the "regional drive" mode indicates a case that the regional control bringing the IGBT elements PD1 and PD2 described above into action synchronously and bringing the IGBT elements PD3 and PD4 into action synchronously is performed.

With regard to this experimentation, the operation is performed with sufficiently a low current value as compared with a rated current of the IGBT elements PD1 to PD4, thus the value of the steady loss is not high in either of those drive modes.

In the meantime, the value of the switching loss is larger than the value of the steady loss in both the drive modes and the amount of the switching loss in the "regional drive" mode marks a 20% fall as compared with the amount of the switching loss in the "general drive" mode. Moreover, with regard to the overall loss also, the amount of the overall loss in the "regional drive" mode marks a 14% fall as compared with the amount of the overall loss in the "general drive" mode.

In other words, a high effect of controlling the increase of the amount of the power loss caused by the tail current of this power semiconductor device is promised, in case that the operation is performed with the current value low enough as compared with the rated current of the IGBT elements PD1 to PD4 and with a high switching frequency. Moreover, it becomes possible to make the current amount flowing in the IGBT elements PD1 to PD4 equal, and the heat in the particular IGBT element becomes hard to arise.

In the meantime, for example, in case of bringing the IGBT elements PD1 to PD4 into action with the large current close to the value of the rated current of them, or in case of bringing the IGBT elements PD1 to PD4 into action with the low switching frequency, the value of the steady loss tends to be larger than the value of the switching loss.

As described above, the steady loss is attributable mainly to the ON resistance of the power semiconductor element. The ON resistance (in other words, an inclination of an I-V characteristic) has a non-liner shape in the semiconductor element, therefore, when the current amount flowing in a part of the IGBT element is enlarged with selecting the "regional drive" mode, a total amount of the steady loss increases as compared with a case of controlling the current amount flowing in the respective IGBT elements to be small with selecting the "general drive" mode.

Therefore, in case that the switching loss has a small proportion and the steady loss increasing by performing the regional control has a great proportion in the overall loss, it is supposed to be preferable to select the general control. The reason is that it becomes possible to control an increase of the overall loss with selecting the general control.

Moreover, with regard to the power semiconductor device according to the present preferred embodiment, a synchronized operation of the IGBT elements PD1 and PD2 and a synchronized operation of the IGBT elements PD3 and PD4 in the regional control are performed on each pulse of the PWM signal S0 basis.

In case of the PWM signal, pulse widths of the pulses nearest each other are almost the same, thus it is possible to make an operating time of the respective IGBT elements almost equal in the regional control. According to this, it becomes possible to make a consumed power in the respective IGBT elements equal, and the heat in the particular IGBT element becomes harder to arise.

Figure 5:
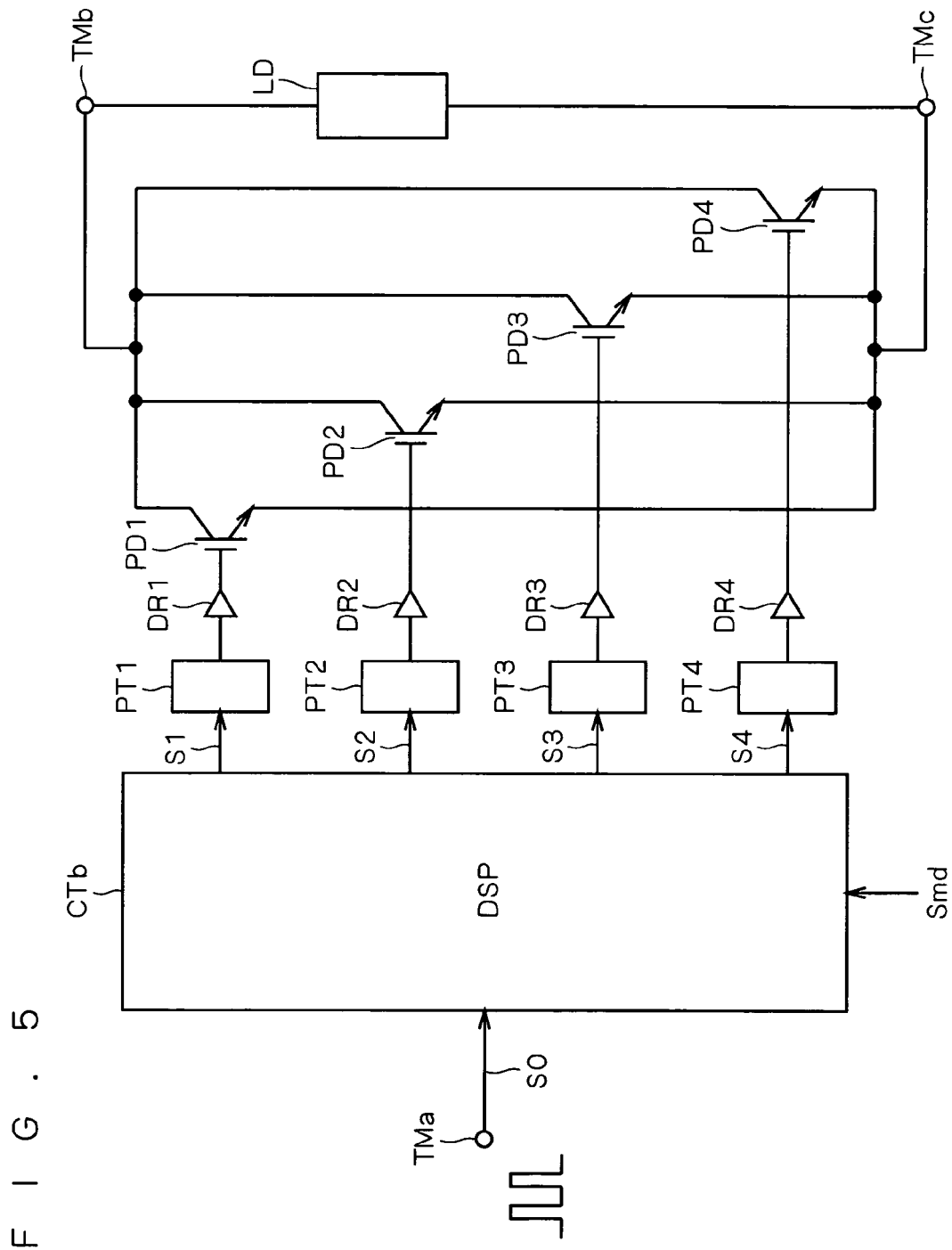
FIG. 5 is a drawing illustrating a modification example of the power semiconductor device according to the preferred embodiment 1.

Besides, FIG. 5 is a modification example of the power semiconductor device according to the present preferred embodiment. In FIG. 1, the control part CTa is composed of the flip-flop and the gate circuit illustrated in FIG. 2.

However, the similar function is also realizable by applying a DSP (Digital Signal Processor), a microprocessor and so on to the control part. In other words, it is possible to select either providing the PWM signal S0 for the entire IGBT elements PD1 to PD4 or repeating the similar control providing a pulse of the PWM signal S0 for the IGBT elements PD1 and PD2 synchronously, and after that, providing a next pulse for the IGBT elements PD3 and PD4 synchronously according to the contents of the mode designation signal Smd, by setting up appropriately a control program for the DSP, the microprocessor and so on.

Therefore, in FIG. 5, a control part CTb composed of the DSP is placed in exchange for the control part CTa in FIG. 1. The rest is similar to FIG. 1.

The selection either applying the DSP and the microprocessor or applying the flip-flop and the gate circuit should be determined with considering the amount of the number of the drive element, a complexity of a control pattern, a cost for a circuit composition and so on.

Besides, the number of the IGBT element is described as four, that is, PD1 to PD4 in the above description, however, the present invention is not limited to this number definitely, but the plural number is applicable.

Moreover, the number of the synchronized operation of the element is described as two at a time, that is, PD1 and PD2, and PD3 and PD4, however, the present invention is not limited to this number.

Figure 6:
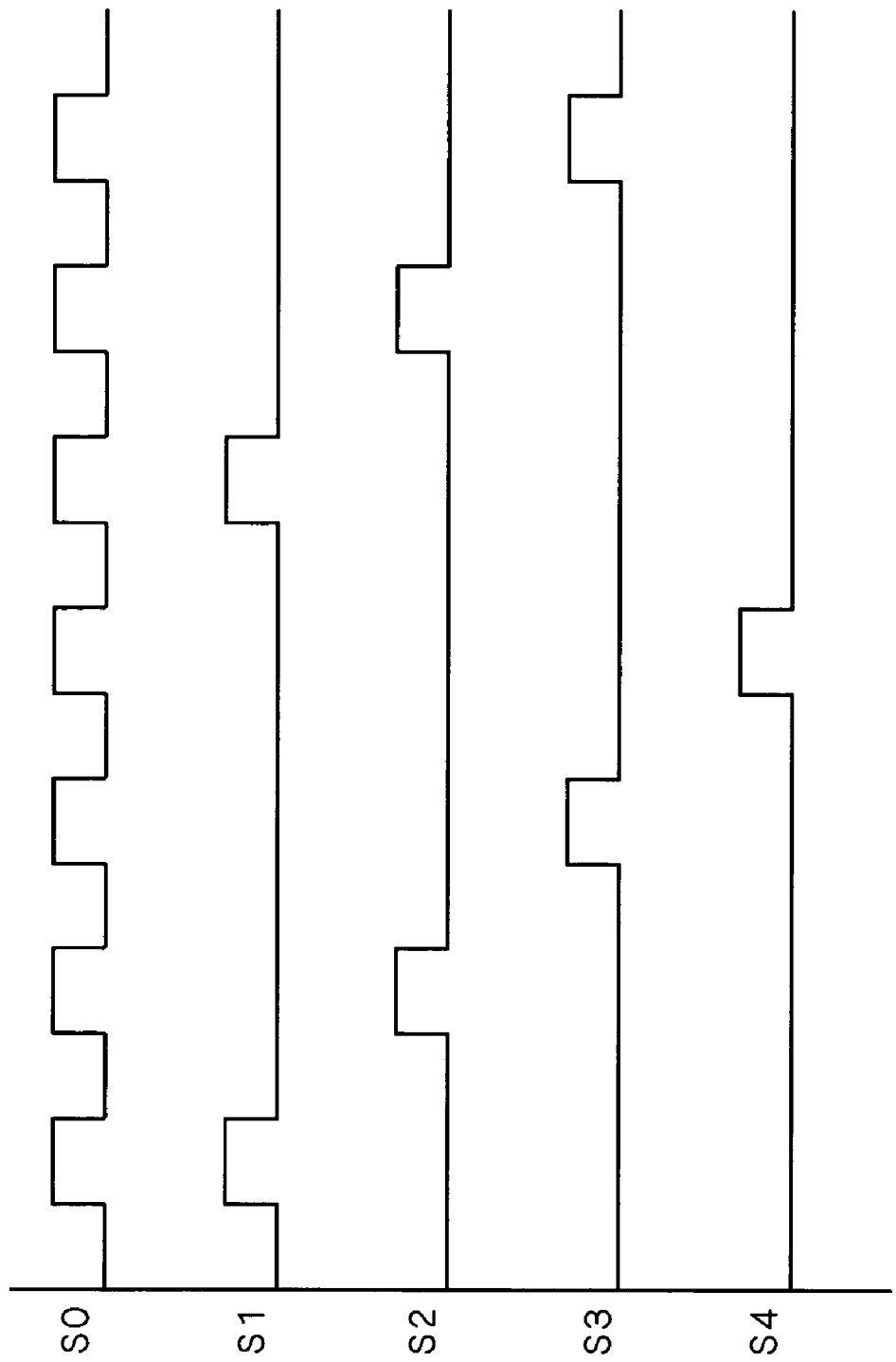
FIG. 6 is a timing chart illustrating an aspect of the respective signals when another regional control is performed.

One of the IGBT elements PD1 to PD4 can be made to operate at a time in each pulse of the PWM signal S0 as illustrated in a timing chart of FIG. 6, for example. Such a regional control is easily realizable by setting up appropriately the control program of the control part CTb in FIG. 5, or combining appropriately the flip-flop and the gate circuit in the control part CTa in FIG. 1.

Figure 3:
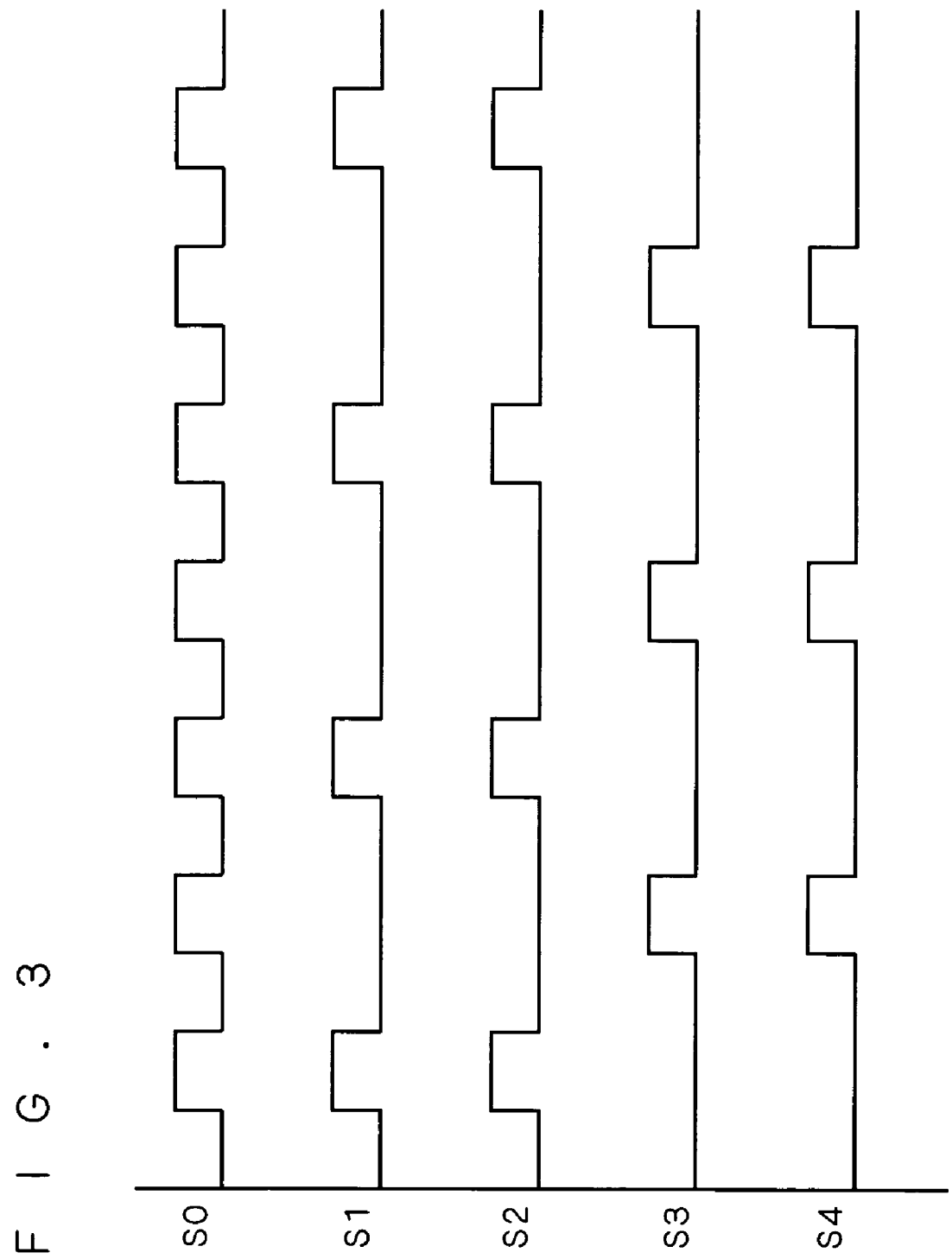
FIG. 3 is a timing chart illustrating an aspect of respective signals when a regional control is performed.

Besides, in FIG. 3 and FIG. 6, the switch of the operating elements is performed every pulse of the PWM signal S0 when the regional control is performed, however, the switch can also be performed every plural pulses, that is, two pulses, three pulses and so on, for example. In this case, after the IGBT elements PD1 and PD2 operate synchronously measuring up to the number of the continuous plural pulses, in the same manner, the IGBT elements PD3 and PD4 are supposed to operate synchronously measuring up to the number of the continuous plural pulses, with regard to the circuit in FIG. 1, for example.

Preferred Embodiment 2

The present preferred embodiment is a modification example of the power semiconductor device according to the preferred embodiment 1, and the object is to detect information (concretely, a temperature) corresponding to an operating condition of the IGBT elements PD1 to PD4 and select the element which should be made to operate when the regional control is performed, according to a detecting result.

Figure 7:
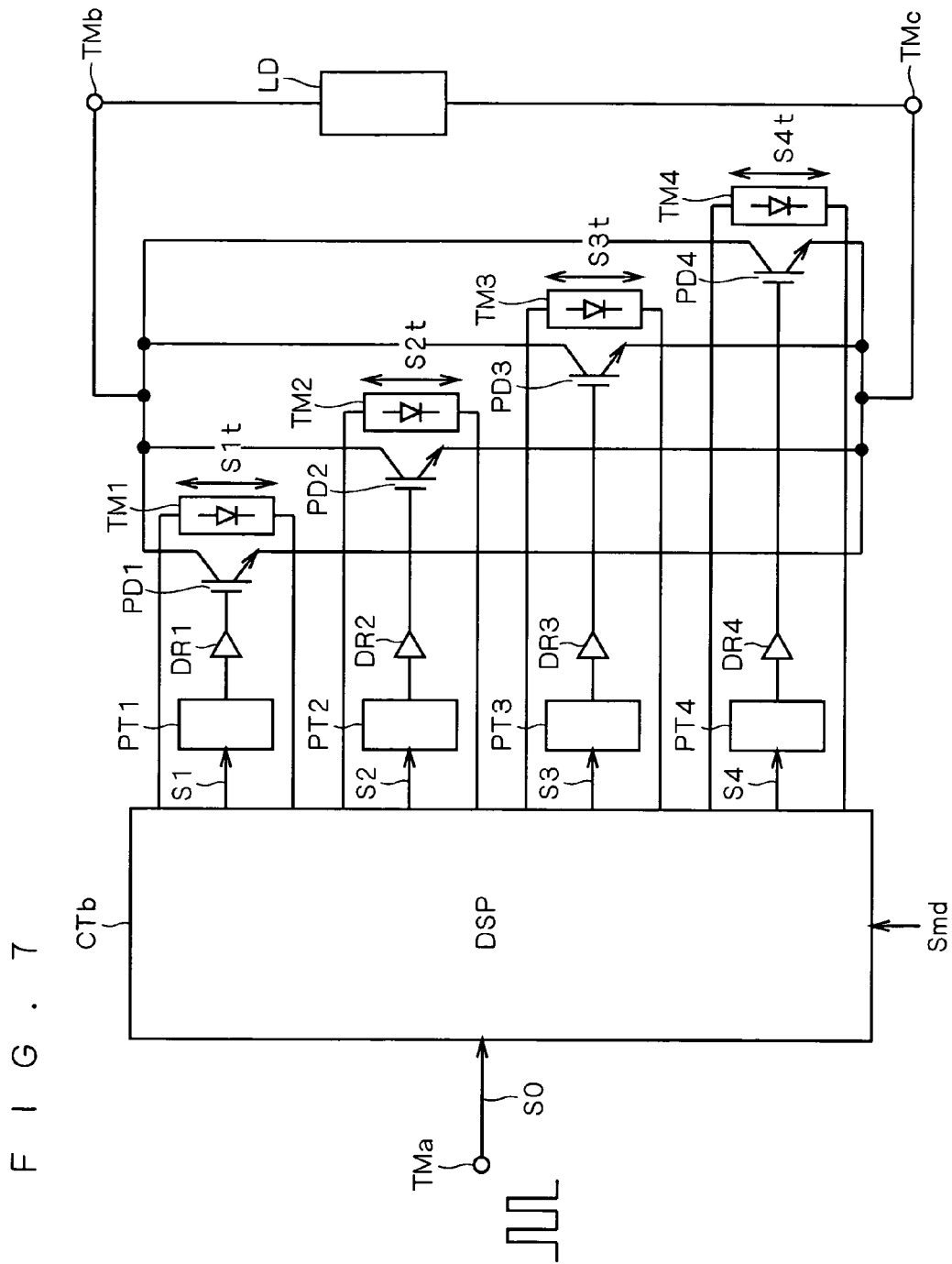
FIG. 7 is a drawing illustrating a power semiconductor device according to a preferred embodiment 2.

FIG. 7 is a drawing illustrating a power semiconductor device according to the present preferred embodiment. In FIG. 7, temperature sensors TM1 to TM4 are placed adjacent to the IGBT elements PD1 to PD4, respectively, in addition to the composition of the power semiconductor device in FIG. 5. The rest is similar to the power semiconductor device according to the preferred embodiment 1.

Each of these temperature sensors TM1 to TM4 is a semiconductor temperature sensor employing a pn junction diode, for example, and is formed by depositing a pn layer through an insulating layer on a substrate in which the IGBT elements PD1 to PD4 are formed.

According to the semiconductor temperature sensor employing the pn junction diode, it is possible to detect a temperature from an anode-cathode voltage by retaining a forward current between the pn junctions to be a determinate value. Therefore, the control part CTb can detect an operating temperature of the respective IGBT elements PD1 to PD4 by flowing the current in the temperature sensors TM1 to TM4 from the control part CTb and monitoring respective anode-cathode voltages S1$t$ to S4$t$.

Figure 8:
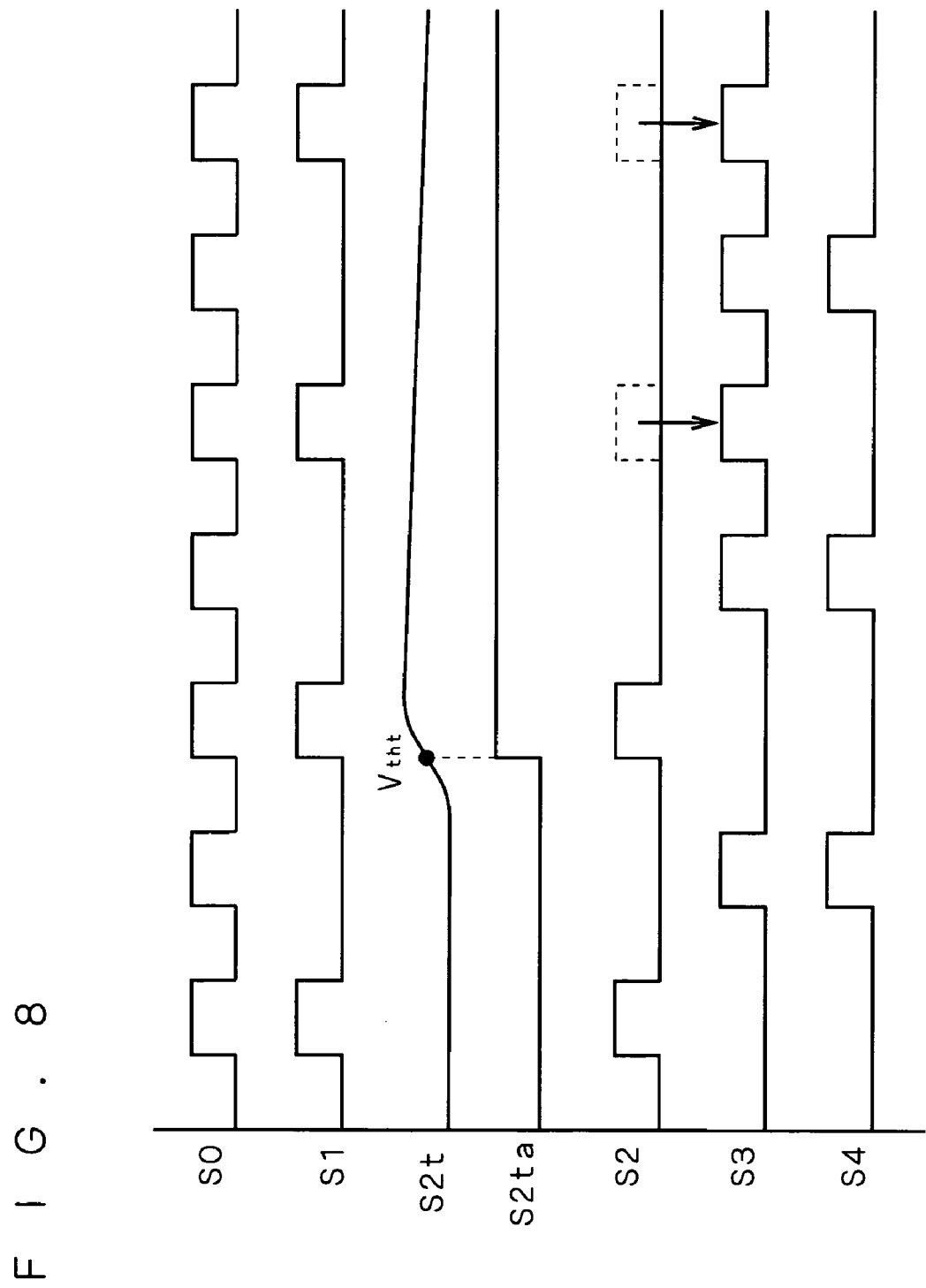
FIG. 8 is a timing chart illustrating an aspect of the respective signals when a regional control is performed.

The control part CTb selects the IGBT element which should be made to operate when the regional control is performed on the basis of the detecting result of the operating temperature of the respective IGBT elements PD1 to PD4. FIG. 8 is a timing chart illustrating an aspect of this selection. Here, the operating temperature of the IGBT element PD2 is focused as an example.

An A/D (Analog→Digital) conversion of the respective anode-cathode voltages S1$t$ to S4$t$ is performed in the control part CTb, and a comparator in the control part CTb monitors if the converted value exceeds a determinate threshold voltage Vtht.

In case that the anode-cathode voltage S2$t$ of the temperature sensor TM2 corresponding to the IGBT element PD2 rises and exceeds the threshold voltage Vtht as illustrated in FIG. 8, the control part CTb determines that the operating temperature of the IGBT element PD2 becomes too high, and causes the IGBT element PD2 to stop operation.

Moreover, for example, the control part CTb makes the IGBT element PD3, which has not operated synchronously with the IGBT element PD2, perform a substitutive function of the IGBT element PD2. In other words, the control part CTb repeats the regional control bringing the IGBT elements PD1 and PD3 into action by providing the PWM signal S0 for the gates of them and after the operation is finished, then bringing the IGBT elements PD3 and PD4 into action by providing the PWM signal S0 for the gates of them.

According to this, it is possible to make the IGBT element PD2 rest in which a disproportionate heat starts to arise, and it becomes possible to make the operating temperature fall. In FIG. 8, the anode-cathode voltage S2$t$ decreases gradually after exceeding the threshold voltage Vtht, and a fall of the operating temperature is illustrated.

Moreover, when the anode-cathode voltage S2t becomes again the same value with the threshold voltage Vtht or less, the regional control similar to that in FIG. 3 should be performed with driving the IGBT element PD2.

According to the power semiconductor device according to the present preferred embodiment, the temperature sensors TM1 to TM4 which are detecting parts detecting information corresponding to the operating condition of the IGBT elements PD1 to PD4 are included. Moreover, the temperature sensors TM1 to TM4 provide information of the detected operating temperature for the control part CTb, and the control part CTb selects the element which should be made to operate among the IGBT elements PD1 to PD4 on the basis of that information.

According to this, it becomes possible to cause the element whose operating condition is poor to stop the operation among the IGBT elements PD1 to PD4, and bring only the other elements into action. Therefore, even in case that the operating temperature of a certain IGBT element becomes too high, it becomes possible to cause it to stop the operation and fall the operating temperature by bringing only the other elements into action. According to this, the heat in the particular IGBT element becomes harder to arise.

Moreover, with regard to the power semiconductor device according to the present preferred embodiment, the temperature sensors TM1 to TM4 are plurally placed corresponding to the respective IGBT elements PD1 to PD4. According to this, it is possible to detect the operating temperature of the respective IGBT elements, and the control part CTb can select the IGBT element which should be made to operate when the regional control is performed more appropriately.

Besides, it is preferable to place the temperature sensors TM1 to TM4 separately as described above, however, the present invention is not necessarily limited to this. For example, it is also applicable to place one temperature sensor covering both the IGBT elements PD1 and PD2 operating synchronously, and place the other temperature sensor covering both the IGBT elements PD3 and PD4.

Moreover, in FIG. 8 described above, in case that the operating temperature of the IGBT elements PD2 becomes too high, the operation is allotted to the IGBT element PD3, however, it is also possible to allot it to both the IGBT elements PD3 and PD4, for example. Otherwise, it is also possible to allot the operation of the IGBT element PD2 to the element of lower operating temperature with comparing the IGBT elements PD3 with PD4, considering the detecting result of the operating temperature of them, also.

These operations are easily realizable by setting up appropriately the control program of the DSP which is the control part CTb in advance.

Preferred Embodiment 3

The present preferred embodiment is a modification example of the power semiconductor device according to the preferred embodiment 1, too, and a resistance which is a detector of the current flowing through the respective IGBT elements PD1 to PD4 in emitters of the respective elements instead of the temperature sensors TM1 to TM4 in the preferred embodiment 2.

Figure 9:
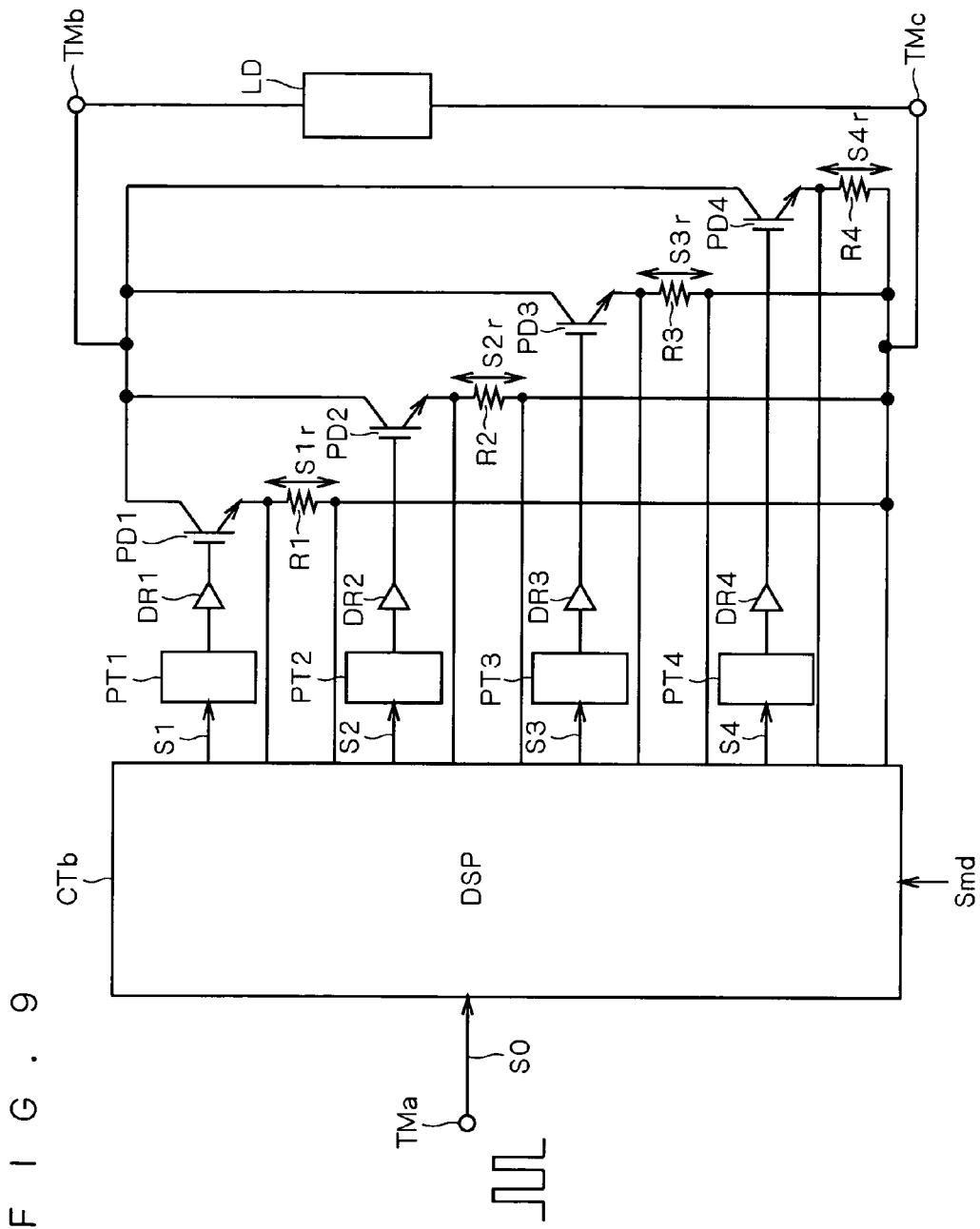
FIG. 9 is a drawing illustrating a power semiconductor device according to a preferred embodiment 3.

FIG. 9 is a drawing illustrating the power semiconductor device according to the present embodiment. Besides, in FIG. 9, the power semiconductor device is identical with that in FIG. 5 except for a point that resistances R1 to R4 are placed in the emitters of the respective IGBT elements PD1 to PD4, respectively.

These resistances R1 to R4 are all parts of a wiring layer placed on the semiconductor substrate in which the IGBT elements PD1 to PD4 are formed, for example.

The control part CTb can detect the current amount flowing between the emitter and the collector of the IGBT elements PD1 to PD4 by monitoring voltage drop amounts S1r to S4r in the resistances R1 to R4. Moreover, the control part CTb can figure out the steady loss with employing the given value of the respective ON resistances of the IGBT elements PD1 to PD4, if the emitter-collector current of the IGBT elements PD1 to PD4 can be detected.

As described above, the steady loss increases by making the number of the IGBT element operating synchronously during the regional control decrease. Therefore, it is described that in case that a contribution of the steady loss is larger than a contribution of the switching loss in the overall loss, it is preferable to perform the general control, in the above description.

The present preferred embodiment is also based on this concept, and in case that the emitter-collector current of the IGBT elements PD1 to PD4 increases, and the increase of the steady loss is recognized, the steady loss is controlled by making the number of the IGBT element operating synchronously increase. In other words, the control part CTb selects the IGBT elements which should be made to operate when the regional control is performed, on the basis of the detecting result of the conducting current amount of the respective IGBT elements PD1 to PD4.

Figure 10:
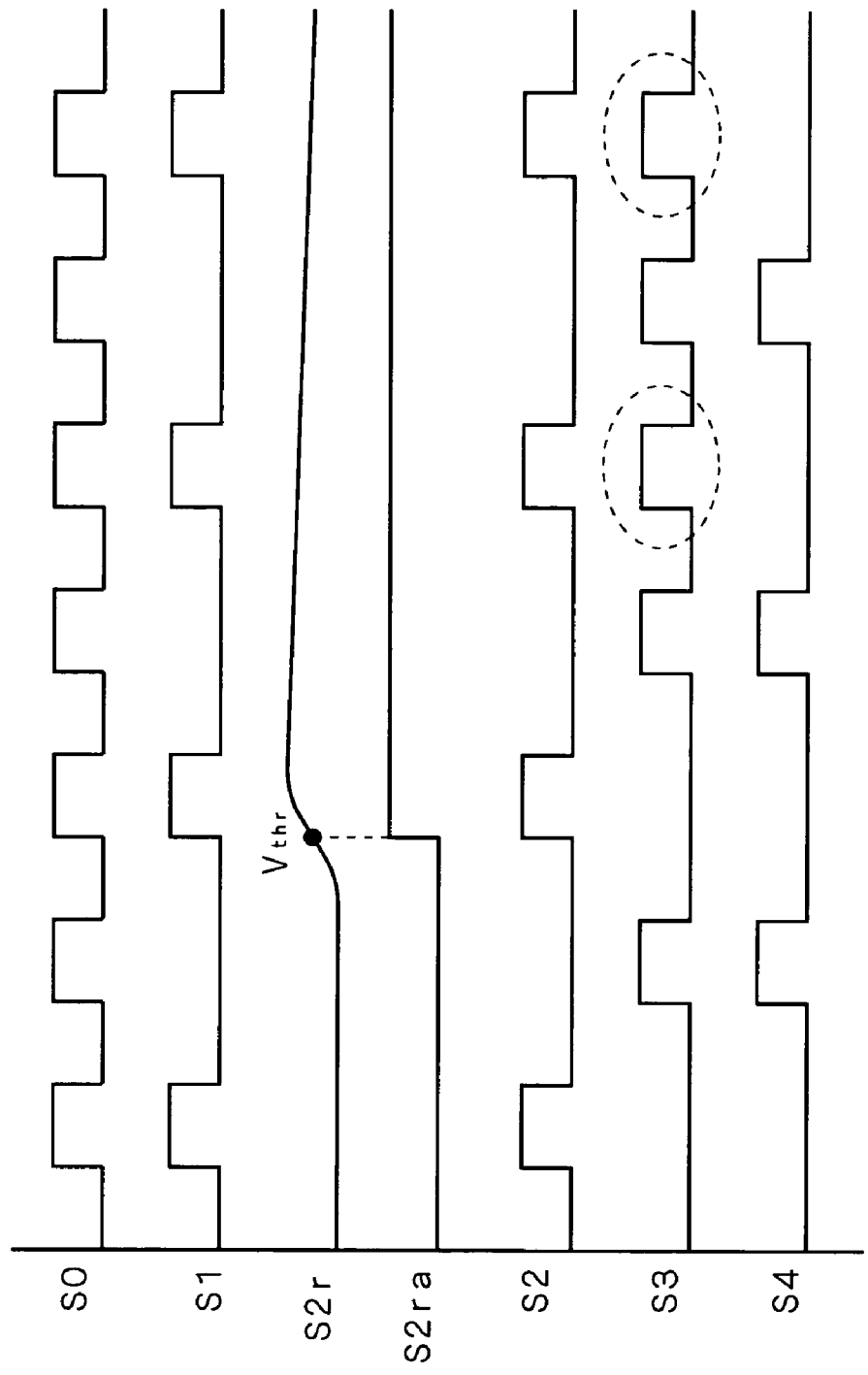
FIG. 10 is a timing chart illustrating an aspect of the respective signals when a regional control is performed.

FIG. 10 is a timing chart illustrating an aspect of this selection. Here, the conducting current amount of the IGBT elements PD2 is focused as an example.

The A/D conversion of the voltage drop amounts S1r to S4r in the respective resistances is performed in the control part CTb, and the comparator in the control part CTb monitors if the converted value exceeds a predetermined threshold voltage Vthr.

In case that the voltage drop amount S2r in the resistance R2 corresponding to the IGBT element PD2 rises and exceeds the threshold voltage Vthr as illustrated in FIG. 10, the control part CTb determines that the steady loss in the IGBT element PD2 becomes too large.

Moreover, the control part CTb performs the regional control with adding the IGBT element PD3, too, for example, which has not operated synchronously with the IGBT element PD2. In other words, the control part CTb repeats the regional control bringing the IGBT elements PD1 to PD3 into action by providing the PWM signal S0 for the gates of them and after the operation is finished, then bringing the IGBT elements PD3 and PD4 into action by providing the PWM signal S0 for the gates of them.

According to this, it becomes possible to decrease the steady loss by increasing the number of the IGBT element operating synchronously when the regional control is performed. In FIG. 10, the voltage drop amount S2r in the resistance R2 decreases gradually after exceeding the threshold voltage Vthr, and the decrease of the steady loss is illustrated.

Moreover, when the voltage drop amount S2r in the resistance R2 becomes again the same value with the threshold voltage Vthr or less, the regional control similar to that in FIG. 3 should be performed with releasing the synchronous operation of the IGBT element PD3 with the IGBT element PD2.

According to the power semiconductor device according to the present preferred embodiment, the resistances R1 to R4 which are current detectors detecting information corresponding to the operating condition of the IGBT elements PD1 to PD4 are included. Moreover, the resistances R1 to R4 provide information of the detected conducting current amount for the control part CTb as the voltage drop amounts S1r to S4r, and the control part CTb selects the element which should be made to operate among the IGBT elements PD1 to PD4 on the basis of that information.

According to this, it becomes possible to increase the element which should be made to operate synchronously when the regional control is performed in the IGBT elements PD1 to PD4. Therefore, the control part CTb can select appropriately the IGBT elements PD1 to PD4 which should be controlled, when the steady loss increasing by performing the regional control comes to have a large proportion in the overall loss which is an aggregation of the steady loss and the switching loss.

Moreover, with regard to the power semiconductor device according to the present preferred embodiment, the resistances R1 to R4 are plurally placed corresponding to the respective IGBT elements PD1 to PD4. According to this, it is possible to detect the conducting current amount of the respective IGBT elements, and the control part CTb can select more appropriately the IGBT element which should be made to operate when the regional control is performed.

Besides, it is preferable to place the resistances R1 to R4 separately as described above, however, the present invention is not necessarily limited to this. For example, it is also applicable to place one resistance whose edge is connected with the emitters of both the IGBT elements PD1 and PD2 operating synchronously, and place the other resistance whose edge is connected with the emitters of both the IGBT elements PD3 and PD4.

Moreover, in FIG. 10 described above, in case that the conducting current amount of the IGBT elements PD2 becomes too large, the IGBT element PD3 is made to perform the additional operation, however, it is also possible to make both the IGBT elements PD3 and PD4 perform the additional operation, for example.

Moreover, it is also applicable that the IGBT elements PD3 and PD4 are made to operate in addition when bringing the IGBT elements PD1 and PD2 into action, and the IGBT elements PD1 and PD2 are made to operate in addition when bringing the IGBT elements PD3 and PD4 into action, in other words, to switch to the general operation.

These operations are easily realizable by setting up appropriately the control program of the DSP which is the control part CTb in advance.

Preferred Embodiment 4

The present preferred embodiment is a modification example of the power semiconductor device according to the preferred embodiment 1, detects the emitter-collector voltage of the IGBT elements PD1 to PD4 and in case that a backward voltage exceeds a predetermined value when a IGBT element is in action, the other elements are also made to operate, when the regional control is performed.

Figure 11:
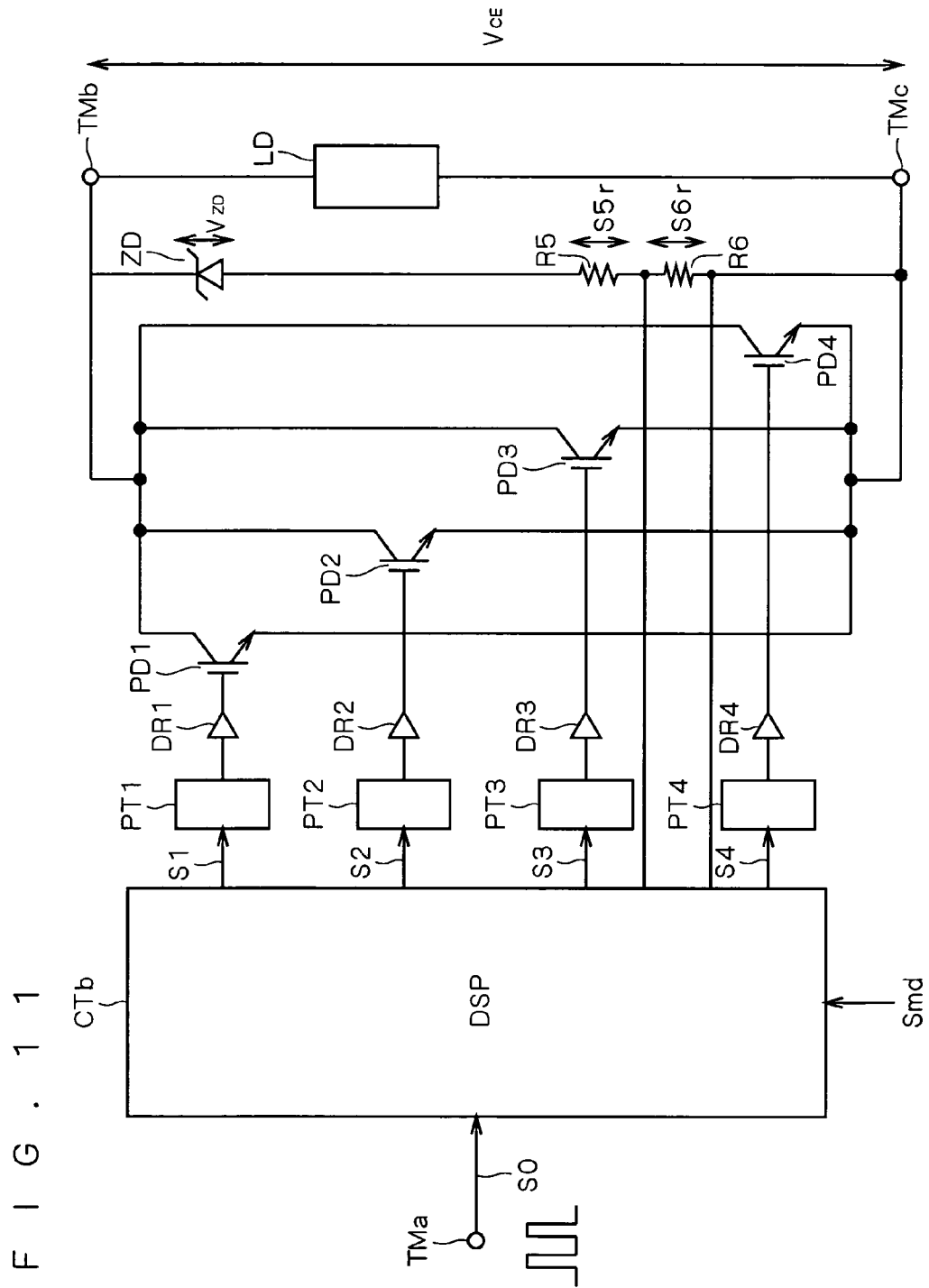
FIG. 11 is a drawing illustrating a power semiconductor device according to a preferred embodiment 4.

FIG. 11 is a drawing illustrating the power semiconductor device according to the present preferred embodiment. Besides, in FIG. 11, a series connection of a zener diode ZD and resistances R5 and R6 is inserted between the terminals TMb and TMc in addition to the composition of the power semiconductor device in FIG. 5. The rest is the same as the power semiconductor device in FIG. 5.

This zener diode ZD is composed of the pn junction in the semiconductor substrate in which the IGBT elements PD1 to PD4 are formed, for example, and moreover, both the resistances R5 and R6 are the parts of the wiring layer on the semiconductor substrate in which IGBT elements PD1 to PD4 are formed, for example.

Meanwhile, when the respective IGBT elements PD1 to PD4 are in a conducting state by the regional control or the general control, a forward voltage is applied between the emitter and the collector of the respective elements as an emitter-collector voltage $V_{CE}$, and the forward current flows there.

In the meantime, a surge current of a backward direction flows temporarily between the emitter and the collector of the element at the adjacency of an end of the conduction. There is no problem if this surge current is within an allowable range, however, there is also a possibility that it exceeds the allowable range and causes a fatal breakage of the element. In this case, the extreme high backward voltage is applied as the emitter-collector voltage $V_{CE}$.

With regard to the present preferred embodiment, the zener diode ZD and the resistance R5 and R6 function as a voltage detector of the emitter-collector voltage $V_{CE}$. Specifically, when the backward voltage exceeds a predetermined zener voltage $V_{ZD}$ as the emitter-collector voltage $V_{CE}$, the zener diode comes to be in the conducting state in the backward direction, and the current flows in the resistances R5 and R6. The emitter-collector voltage $V_{CE}$ is devided by the resistances R5 and R6, and the voltage is divided into voltage drop amounts S5r and S6r in the respective resistances. Moreover, the control part CTb can detect the backward voltage of the emitter-collector voltage $V_{CE}$ of the IGBT elements PD1 to PD4 by monitoring the voltage drop amount S6r in the resistance R6.

As described above, the large surge current of the backward direction sometimes flows temporarily between the emitter and the collector of the element at the adjacency of the end of the conduction of the element. Therefore, in this case, it is preferable to divide the surge current among many elements to prevent the breakage of the element, even in case of performing the regional control.

Consequently, with regard to the present preferred embodiment, when detecting that the backward voltage of the emitter-collector voltage $V_{CE}$ exceeds the predetermined value when the regional control is performed to a part of the IGBT element PD1 to PD4, the other IGBT elements are also made to operate in addition to the element in action. In other words, the control part CTb selects the IGBT elements which should be made to operate in addition at the adjacency of the end of the conduction of the element when the regional control is performed, on the basis of the detecting result of the emitter-collector voltage $V_{CE}$ of the respective IGBT elements PD1 to PD4.

Figure 12:
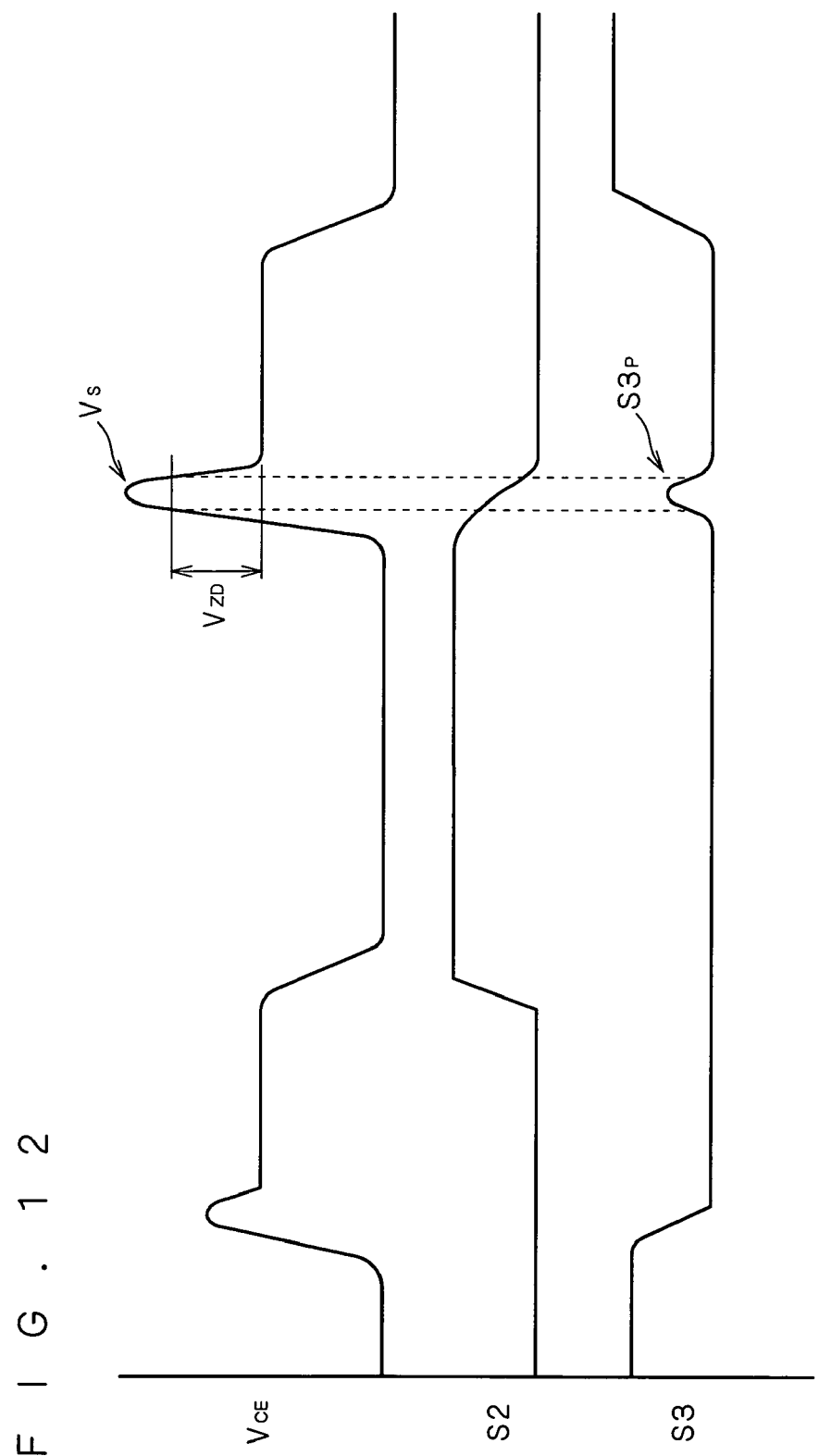
FIG. 12 is a timing chart illustrating an aspect of a backward voltage and the respective signals when the regional control is performed.

FIG. 12 is a timing chart illustrating this aspect. Here, a case of bringing the IGBT elements PD1 and PD2 into action by the regional control is focused as an example.

The control part CTb monitors the voltage drop amount S6r in the resistance R6, and monitors if the current flows in the resistance R6 or not.

As illustrated in FIG. 12, in case that the backward voltage of the emitter-collector voltage $V_{CE}$ rises and exceeds the zener voltage $V_{ZD}$ at the adjacency of the end of the conduction of the IGBT elements PD1 and PD2, the control part CTb determines that the large backward current flows in the IGBT elements PD1 and PD2.

Moreover, the control part CTb performs the regional control with adding temporarily the IGBT element PD3, too, for example, which has not operated synchronously with the IGBT elements PD1 and PD2, in a period Vs in which the emitter-collector voltage $V_{CE}$ exceeds the zener voltage $V_{ZD}$.

In other words, the control part CTb divides the surge current among the IGBT elements PD1 to PD3 in case that the large surge current of the backward direction flows temporarily at the adjacency of the end of the conduction of the element. In FIG. 12, the signal S3 to the IGBT element PD3 becomes temporarily an active S3p only in the period Vs, and the additional operation of the IGBT element PD3 is illustrated.

According to this, it becomes possible to flow the backward current not only in the IGBT elements PD1 and PD2 but also in the IGBT element PD3 dispersively, and it is possible to prevent an overcurrent flowing in the IGBT elements PD1 and PD2.

Besides, in FIG. 12 described above, in case that the emitter-collector voltage $V_{CE}$ exceeds the zener voltage $V_{ZD}$, the IGBT element PD3 is made to operate in addition, however, it is also possible to make both the IGBT elements PD3 and PD4 operate in addition, for example.

These operations are easily realizable by setting up appropriately the control program of the DSP which is the control part CTb in advance.

Preferred Embodiment 5

The present preferred embodiment is also a modification example of the power semiconductor device according to the preferred embodiment 1, and detects the emitter-collector forward voltage of the IGBT elements PD1 to PD4.

Figure 13:
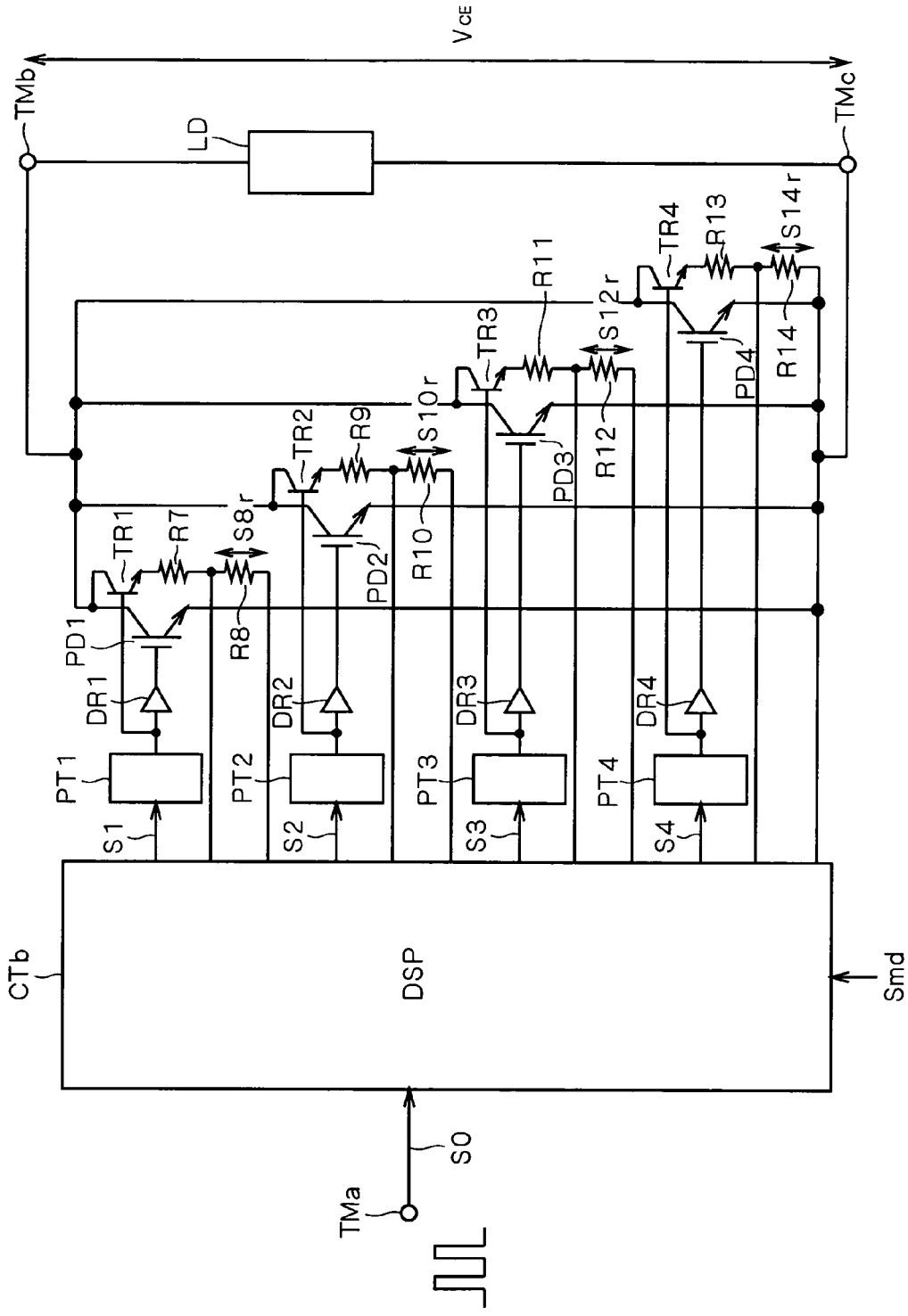
FIG. 13 is a drawing illustrating a power semiconductor device according to a preferred embodiment 5.

FIG. 13 is a drawing illustrating the power semiconductor device according to the present preferred embodiment. Besides, in FIG. 13, respective series connection of a transistor and two resistances are inserted between the emitter and the collector of the respective IGBT elements PD1 to PD4.

Specifically, a series connection of a transistor TR1, resistances R7 and R8 is connected between the emitter and the collector of the IGBT element PD1, a series connection of a transistor TR2, resistances R9 and R10 is connected between the emitter and the collector of the IGBT element PD2, a series connection of a transistor TR3, resistances R11 and R12 is connected between the emitter and the collector of the IGBT element PD3 and a series connection of a transistor TR4, resistances R13 and R14 is connected between the emitter and the collector of the IGBT element PD4, respectively.

Moreover, the signal S1 through the protection circuit PT1 is inputted to the gate of the transistor TR1, the signal S2 through the protection circuit PT2 is inputted to the gate of the transistor TR2, the signal S3 through the protection circuit PT3 is inputted to the gate of the transistor TR3 and the signal S4 through the protection circuit PT4 is inputted to the gate of the transistor TR4, respectively.

The rest is the same as the power semiconductor device in FIG. 5.

With regard to the preferred embodiment 4, the detection of the backward voltage of the IGBT element is performed by inserting the series connection of the zener diode ZD, the resistances R5 and R6 between the emitter and the collector of the IGBT elements PD1 to PD4 in common.

In the present preferred embodiment, a life of each IGBT element is determined by detecting the forward voltage of the respective IGBT elements instead of the backward voltage.

With regard to a silicon substrate in which the IGBT element is formed, a lattice defect occurs due to a secular variation according to a continuation of an employment and the overcurrent. Moreover, when this lattice defect occurs, the forward voltage between the emitter and the collector of the IGBT element increases.

Moreover, in case of the separate IGBT element, it is general that the emitter-collector is fixed on a die pad by a solder. However, when applying the solder, a crack occurs in the solder due to the secular variation, and a resistance of the solder sometimes rises. Also in this case, the forward direction voltage between the emitter and the collector of the IGBT element increases.

Therefore, the control part CTb can detect the forward direction voltage between the emitter and the collector of the IGBT elements PD1 to PD4 by monitoring voltage drop amounts S8r, S10r, S12r and S14r in the resistances R8, R10, R12 and R14, respectively.

Besides, the transistors TR1 to TR4 are employed so that the current flows in the resistances R8, R10, R12 and R14 during only ON state of the IGBT elements PD1 to PD4. Moreover, all of the resistances R7, R9, R11 and R13 are employed for the voltage division so that the voltage drop amounts S8r, S10r, S12r and S14r in the resistances R8, R10, R12 and R14 do not become a large value.

When the respective emitter-collector voltages of the IGBT elements PD1 to PD4 can be detected, the lives of the respective IGBT elements can be determined according to the values of them. It is preferable to plan a life-sustaining procedures by refraining from flowing the current as much as possible, with regard to the IGBT element of short life. The reason is that in case that the power semiconductor elements connected in parallel are modularized to be one power semiconductor device, it is necessary to replace the whole module, when only one of the elements reaches the end of its usefulness, as described above.

Therefore, in the present preferred embodiment, the operation of the element whose emitter-collector forward direction voltage is high in the IGBT elements PD1 to PD4 is made to stop, regarding the element has the short life.

The control part CTb selects the IGBT element which should be made to operate when the regional control is performed on the basis of the detecting result of the emitter-collector forward direction voltage of the respective IGBT elements PD1 to PD4. FIG. 14 is a timing chart illustrating an aspect of this selection. Here, the emitter-collector forward direction voltage of the IGBT element PD2 is focused as an example.

An A/D (Analog-Digital) conversion of the voltage drop amounts S8r, S10r, S12r and S14r in the respective resistances R8, R10, R12 and R14 is performed in the control part CTb, and the comparator in the control part CTb monitors if the converted value exceeds a predetermined threshold voltage Vthv.

In case that the voltage drop amount S10r of the resistance R10 corresponding to the IGBT element PD2 rises and exceeds the threshold voltage Vthv as illustrated in FIG. 14, the control part CTb determines that the IGBT element PD2 has a short life, and causes the IGBT element PD2 to stop operation.

Moreover, the control part CTb makes the IGBT element PD3, for example, which has not operated synchronously with the IGBT element PD2 perform a substitutive function of the IGBT element PD2. In other words, the control part CTb repeats the regional control bringing the IGBT elements PD1 and PD3 into action by providing the PWM signal S0 for the gates of them and after the operation is finished, then bringing the IGBT elements PD3 and PD4 into action by providing the PWM signal S0 for the gates of them.

According to this, it is possible to make the IGBT element PD2 rest which is determined to have the short life, and it becomes possible to perform a life-sustaining procedures.

According to the power semiconductor device according to the present preferred embodiment, the resistances R8, R10, R12 and R14 detecting the emitter-collector forward direction voltage of the IGBT elements PD1 to PD4 are included. Moreover, information of the voltage drop amounts S8r, S10r, S12r and S14r in the resistances R8, R10, R12, and R14 is provided for the control part CTb, and the control part CTb selects the IGBT elements PD1 to PD4 which should be made to operate when the regional control is performed on the basis of that information.

According to this, it becomes possible to cause the element which has a short life to stop the operation among the IGBT elements PD1 to PD4, and bring only the other elements into action. Therefore, it becomes possible to sustain the life as the whole power semiconductor device.

Moreover, with regard to the power semiconductor device according to the present preferred embodiment, the series connection of the transistor and the two resistances are plurally employed corresponding to the respective IGBT elements PD1 to PD4. According to this, it is possible to detect the respective lives of the respective IGBT elements, and the control part CTb can select the IGBT element which should be made to operate when the regional control is performed more appropriately.

Besides, it is preferable to employ the series connection of the transistor and the two resistances respectively as described above, however, the present invention is not necessarily limited to this. For example, it is also applicable to place a series connection of one set of the transistor and the two resistances corresponding to the IGBT elements PD1 and PD2 operating synchronously, and place other series connection of another one set of the transistor and the two resistances corresponding to the IGBT elements PD3 and PD4.

Moreover, in FIG. 14 described above, in case that the emitter-collector forward direction voltage of the IGBT element PD2 becomes high, the operation is allotted to the IGBT element PD3, however, it is also possible to allot it to both the IGBT elements PD3 and PD4, for example. Otherwise, it is also possible to allot the operation of the IGBT element PD2 to the element of longer life, in other words, of less variation of the emitter-collector forward direction voltage comparing the IGBT elements PD3 with PD4, considering the detecting result of the emitter-collector forward direction voltages of them, also.

These operations are easily realizable by setting up appropriately the control program of the DSP which is the control part CTb in advance.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device, comprising:
plural power semiconductor elements which have a control electrode and a first and a second current electrodes, respectively, and said first current electrodes are connected with each other and said second current electrodes are connected with each other, respectively;
at least one detecting part detecting information corresponding to an operating condition of said plural power semiconductor elements; and
a control part controlling said plural power semiconductor elements, wherein
said control part repeats a regional control operation to operate a first group of said plural power semiconductor elements by providing a first input signal for each of said control electrodes of said first group, and to operate a second group of said plural power semiconductor elements by providing a second input signal for each of said control electrodes of the second group after an operation of said first group is finished,
said detecting part provides said information for said control part, and
said control part selects said first group and said second group of said plural power semiconductor elements being made to operate when said regional control operation is performed on the basis of said information.

2. The power semiconductor device according to claim 1, wherein
said control part can select either performing a general control operation activating all of said plural power semiconductor elements identically by providing said first and second input signal for all of said control electrodes of the first and second groups or repeating said regional control operation.

3. The power semiconductor device according to claim 1, wherein said first and second input signals consist of a pulse row, and
said control part performs said operation of said first group and an operation of said second group in said regional control operation on each pulse basis.

4. The power semiconductor device according to claim 1, wherein
said at least one detecting part comprises plural detecting parts, and
said plural detecting parts are employed corresponding to said plural power semiconductor elements, respectively.

5. The power semiconductor device according to claim 1, wherein
said detecting part is a temperature sensor, and said information is an operating temperature of said power semiconductor element.

6. The power semiconductor device according to claim 1, wherein
said detecting part is a current detector, and said information is a current flowing between said first and said second current electrodes of said power semiconductor element.

7. The power semiconductor device according to claim 1, wherein
said detecting part is a voltage detector, and said information is a voltage between said first and said second current electrodes of said power semiconductor element.

8. The power semiconductor device according to claim 7, wherein
said control part also operates at least one of said second group of said plural power semiconductor elements in addition to said first group, in case a backward voltage between said first and said second current electrodes of said first group of said plural power semiconductor elements exceeds a predetermined value, when said regional control operation is performed.

* * * * *